(12) United States Patent
Ma et al.

(10) Patent No.: US 10,516,420 B1
(45) Date of Patent: *Dec. 24, 2019

(54) HIGH SPEED DIGITAL BIT GENERATOR FOR OPTICAL FRONTAL INTERFACE

(71) Applicant: Mitsubishi Electric Research Laboratories, Inc., Cambridge, MA (US)

(72) Inventors: Rui Ma, Carlisle, MA (US); Daniel Antonio Da Costa Dinis, Santa Comba Dao/Viseu (PT); Yukimasa Nagai, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/217,491

(22) Filed: Dec. 12, 2018

Related U.S. Application Data

(63) Continuation-in-part of application No. 16/006,101, filed on Jun. 12, 2018, now Pat. No. 10,187,232.

(51) Int. Cl.
| | |
|---|---|
| H04L 25/49 | (2006.01) |
| H04B 1/00 | (2006.01) |
| H04L 1/00 | (2006.01) |
| H03M 3/00 | (2006.01) |

(52) U.S. Cl.
CPC ............ H04B 1/0017 (2013.01); H03M 3/30 (2013.01); H04B 1/0014 (2013.01); H04L 1/0057 (2013.01); H04L 1/0071 (2013.01)

(58) Field of Classification Search
CPC ............ H04L 25/4917; H04L 25/4902; H04L 7/0029; H04L 7/0091; H04L 27/20
See application file for complete search history.

(56) References Cited

U.S. PATENT DOCUMENTS

| | | | |
|---|---|---|---|
| 10,187,232 B1* | 1/2019 | Ma ...................... | H04L 25/4917 |
| 2014/0153929 A1* | 6/2014 | Sun ..................... | H04B 10/5165 |
| | | | 398/115 |

* cited by examiner

*Primary Examiner* — Dhaval V Patel
(74) *Attorney, Agent, or Firm* — Gennadiy Vinokur; James McAleenan; Hironori Tsukamoto

(57) ABSTRACT

A radio frequency (RF) transmitter includes a set of input ports to receive baseband, a set of filter banks for each input port that includes a plurality of digital polyphase interpolation filters, and a set of oscillators banks, wherein each oscillator bank includes a plurality of polyphase Digital Direct Synthesizer (DDS) corresponding to the plurality of digital polyphase interpolation filters. The RF transmitter includes a set of mixer banks to mix corresponding sequences of samples of digital waveform, a parallel digital combiner to combine in-phase sequences of interpolated baseband phased samples, and a pulse encoder to modulate and encode the plurality of sequences of multiband upconverted samples. The RF transmitter converts a plurality of encoded multi-band signals into a RF bitstream and an E/O interface to convert the RF bitstream.

8 Claims, 20 Drawing Sheets

PROPOSED MAPPER FOR THE 3-, 5-, OR 7-LEVEL AMPLIFICATION SCHEME

| $RF_{in}$ | $MGT_0$ | $MGT_1$ | $MGT_2$ | $MGT_3$ | $MGT_4$ | $MGT_5$ | $MGT_6$ | $MGT_7$ |
|---|---|---|---|---|---|---|---|---|
| 3 | 1 | 1 | 1 | 1 | 1 | 1 | 1 | 1 |
| 2 | 0 | 1 | 1 | 1 | 1 | 1 | 1 | 1 |
| 1 | 0 | 0 | 1 | 1 | 1 | 1 | 1 | 1 |
| 0 | 0 | 0 | 0 | 1 | 1 | 1 | 1 | 1 |
| -1 | 0 | 0 | 0 | 0 | 1 | 1 | 1 | 1 |
| -2 | 0 | 0 | 0 | 0 | 0 | 1 | 1 | 1 |
| -3 | 0 | 0 | 0 | 0 | 0 | 0 | 0 | 0 |

FIG. 14B

HIGH SPEED DIGITAL BIT GENERATOR FOR OPTICAL FRONTAL INTERFACE

CROSS REFERENCES TO RELATED APPLICATIONS

The present application claims a priority to the U.S non-provisional patent application, Ser. No. 16/006,101, entitled "Multi-band radio frequency transmitter" filed in the United State Patent and Trademark office on Jul. 12, 2018.

TECHNICAL FIELD

This invention relates generally to a high speed digital bit generator, and more specifically to a system for a high speed digital bet generator for an optical frontal interface.

BACKGROUND

Wireless communications are an important part of the modern information infrastructure. The last decade has been marked by the exponential spread of handsets, such as smartphones, tablets, as well as new network-dependent devices. The harsh requirements, in terms of high data-rate communication links, have driven the successive generations of standards with higher throughput, mobility-support and increased Quality-of-Service (QoS) and Quality-of-Experience (QoE). Nonetheless, all further progress must be done in a smooth and efficient manner without entailing in increased Operational Expenditure (OPEX)/Capital Expenditure (CAPEX) costs.

Increasingly, this implies that the radio resources must be efficiently exploited, at the same time that higher data-rate wireless access technologies must be developed. To meet the data-rate requirements in an efficient way, the first step involved the augment of the available bandwidths in the 3G systems. Then, in an attempt to achieve scalable wider bandwidths, without spectrum allocation constraints, the concept of CA was introduced in 4G systems, such as Long-Term Evolution (LTE)-Advanced.

By standardizing the contiguous and the non-contiguous CA capabilities, the combination of multiple frequency bands to conduct high-speed data transmission was enabled. Due to the commercial success of LTE-Advanced features, it is expected that they will continue to be evolved, as a part of 5G technologies. To accomplish the Radio Access Network (RAN) expectations in a compact and efficient way, there is a need for the development of flexible, agile and reconfigurable radio transceivers, with a native support for multiple bands and multiple standards. The integration of these features can provide an efficient answer to the establishment of multiple, concurrent and frequency-agile data links between all the RAN parties.

The concept of All-Digital Transmitter (ADT) has been targeted as a promising path towards the development of the next generation of Radio-Frequency (RF) transceivers. The promising potential to design compact and versatile wireless communication transceivers has attracted much and renewed attention. Some methods describe a fully digital datapath from Baseband (BB) up to the RF stage. This enables the design of low-complex and flexible transmitters. The underlying idea is the quantization of an m-bit digital signal into a 2-level representation, resulting in signals with constant envelope. After a digital upconversion to the desired carrier frequency, the pulsed representation can be amplified by highly-efficient and non-linear amplifiers, such as the Switched-Mode Power Amplifiers (SMPAs). After the amplification, a bandpass filter is required to reconstruct the signal before being radiated by the antenna. Their fully digital behavior inherently leads to agile, flexible, reconfigurable, multi-standard, and important for this work, multi-band RF front-ends with minimal external front-end.

Nevertheless, despite the apparent ideal and native support for the multiband capability, design challenges associated with the non-contiguous CA transmission have hampered the proposal of multi-band solutions. Multiband transmission can be achieved with integer multiples of the modulators sampling frequencies, or with reduced sampling rate topologies. Other methods employ bulky and inefficient power combiners to join different bands before transmission. Some of the difficulties in designing multi-band transmission arise from the placement of the Digital Up-Conversion (DUC) after the pulse encoding. Following this approach, as the encoded signals have a considerable amount of out-of-band noise distributed over the entire spectrum, the upconversion to the different bands typically leads to a degraded system performance. One methodology to achieve higher spans between bands is based on the utilization of replicas from different Nyquist Zoness (NZs). However, the inherent decrease in terms of Signal-to-Noise Ratio (SNR), associated with the need of maintaining an integer multiplicity in all the involved sampling rates/frequencies lead to a reduced performance. In addition, the positioning the DUC before the pulse encoding typically implies sampling rates of at least twice the carrier frequency. This imposes challenging requirements in both the Pulse Encoder and in the analog front-end. Accordingly, there is a need for a digital transmitter suitable for contiguous and non-contiguous multi-band transmission.

In optical link applications, the massive data transportation is driving the next generation optical front-haul and back-haul architecture. The conventional analog based front haul solution suffers from nonlinear impairment and inflexibility.

SUMMARY

It is an object of one embodiment to provide a parallel architecture that enables the transmission of contiguous and non-contiguous multi-band signals. It is an object of another embodiment to provide an architecture that can be implemented in a digital domain enabling a digital multi-band radio frequency (RF) transmitter. Such a transmitter sometimes referred as all-digital transmitter (ADT).

The digital RF transmitters typically include digital up-converters (DUC) to up-convert a signal from a baseband frequency to a radio frequency, and a pulse encoder to encode the signal for amplification and transmission. Some embodiments are based on understanding of advantages of placing the pulse encoding before the DUC allowing the pulse encoder to operate with low and limited sampling rates. However, such an arrangement forces the pulse encoder to perform a highly non-linear operation that generates non-bandlimited signals. Such a non-linearity makes the ADTs ill-suited to support concurrent multi-band transmission, because different upconversion stages force out-of-band noise to be merged with the intended transmission signals.

To that end, to enable the multi-band transmission, some embodiments aim to place the DUC before the pulse encoder. However, this arrangement raises challenges in the pulse encoder, due to the stringent sampling rates involved. Thus, there is a need for an architecture that enables the contiguous, and non-contiguous, multi-band transmission of RF signals without unwanted increase of sampling rates in the pulse encoder.

Some embodiments are based on realization that parallel/polyphase equivalent can be found for each subsystem of multi-band RF transmitter allowing multi-band parallelization and serialization of the transmitted signal. Specifically, it is realized that multi-band signal can be parallelized in two dimensions, i.e., within each band and across the bands. In such a manner, the parallelization can be achieved not only for the separate bands, but also for the combination of the bands. Due to multi-band parallelization, the temporal continuity in every clock tick unrolls in the vertical line (interphase timing continuity). Thus, instead of just having one phase being clocked at a given sampling rate, which is higher than at least twice the required carrier frequency, in some embodiments, the maximum sampling rate of each phase is reduced of a factor of M equal to a number of parallel processes for each band.

Accordingly, one embodiment discloses a radio frequency (RF) transmitter for wireless communication. The RF transmitter includes a set of input ports to receive baseband samples of a signal to be transmitted on a set of disjoint frequency bands, each input port receives a sequence of baseband samples for transmission on a corresponding RF frequency band; a set of filter banks, there is one filter bank for each input port, each filter bank includes a plurality of digital polyphase interpolation filters to sample a shifted phase of the corresponding sequence of baseband samples and to interpolate the sampled phases to produce a plurality of sequences of interpolated baseband phased samples with the shifted phase; a set of oscillators banks, there is one oscillator bank for each filter bank, each oscillator bank includes a plurality of polyphase Digital Direct Synthesizer (DDS) corresponding to the plurality of digital polyphase interpolation filters to generate a plurality of sequences of samples of digital waveform, there is one sequence of samples of digital waveform for each of the interpolated baseband phased samples, wherein the sequence of samples of digital waveform is phase synchronized with the corresponding interpolated baseband phased samples, wherein an effective frequency of the digital waveform equals a RF sampling rate divided by the number of the plurality of interpolated baseband phased samples; a set of mixer banks, there is one mixer bank for each filter bank, each mixer bank includes a plurality of parallel digital mixers to mix corresponding sequences of samples of digital waveform and interpolated baseband phased samples to up convert each sequence of interpolated baseband phased samples to the effective frequency; a parallel digital combiner to combine in-phase sequences of interpolated baseband phased samples of different frequency bands to produce a plurality of sequences of multiband upconverted samples; a pulse encoder to modulate and encode the plurality of sequences of multiband upconverted samples to produce a plurality of encoded multi-band signals; a serializer to convert the plurality of encoded multi-band signals into a RF bitstream; a power amplifier to amplify the RF bitstream; a multi-band RF filter to filter the amplified RF bitstream to produce an RF analog signal; and at least one antenna to radiate the RF analog signal.

Another embodiment discloses a method of radio frequency (RF) transmission for wireless communication. The method includes receiving baseband samples of a signal to be transmitted on a set of disjoint frequency bands, each input port receives a sequence of baseband samples for transmission on a corresponding RF frequency band; sampling shifted phases of the sequence of baseband samples for transmission on a corresponding RF frequency band with a plurality of digital polyphase interpolation filters and interpolating the sampled phases to produce a plurality of sequences of interpolated baseband phased samples with the shifted phase; generating a plurality of sequences of samples of digital waveform, there is one sequence of samples of digital waveform for each of the interpolated baseband phased samples, wherein the sequence of samples of digital waveform is phase synchronized with the corresponding interpolated baseband phased samples, wherein an effective frequency of the digital waveform equals a RF sampling rate divided by the number of the plurality of interpolated baseband phased samples; mixing corresponding sequences of samples of digital waveform and interpolated baseband phased samples to up convert each sequence of interpolated baseband phased samples to the effective frequency; combining in-phase sequences of interpolated baseband phased samples of different frequency bands to produce a plurality of sequences of multiband upconverted samples; modulating and encoding the plurality of sequences of multiband upconverted samples to produce a plurality of encoded multi-band signals; converting the plurality of encoded multi-band signals into a RF bitstream; amplifying the RF bitstream; filtering the amplified RF bitstream to produce an RF analog signal; and radiating the RF analog signal.

Yet, another embodiment is based on recognition that real-time ADT can be used in optical link applications. It leverage the advantages of digital signal processing from digital up conversion offered by ADT architecture in this invention and support multi-band transmission concurrently. This is to simply the hardware cost and offer flexibility of next generation optical link for 5G and beyond. This architecture can be applied to front haul of 3GPP Base station like eNode B and User Equipment as multi-band transmitter. For the User Equipment (like smartphone, IoT Device), this architecture can support various combination of wireless communication transmitter. Typical case is to support (1) several 3GPP generation like 2G, 3G, LTE and 5G, (2) Multiple 3GPP generation and Wi-Fi, and (3) 3GPP Carrier Aggregation. So the combination of transmission is flexible because of digital transmission. The detailed standardized specification can be found in the 3GPP standard documents 3GPP TS 38.104.

Accordingly, another embodiment discloses a high speed digital bit generator for an optical frontal interface. The high speed digital bit generator may include a set of input ports to receive baseband samples of a signal to be transmitted on a set of disjoint frequency bands, each input port receives a sequence of baseband samples for transmission on a corresponding RF frequency band; a set of filter banks, there is one filter bank for each input port, each filter bank includes a plurality of digital polyphase interpolation filters to sample a shifted phase of the corresponding sequence of baseband samples and to interpolate the sampled phases to produce a plurality of sequences of interpolated baseband phased samples with the shifted phase; a set of oscillators banks, there is one oscillator bank for each filter bank, each oscillator bank includes a plurality of polyphase Digital Direct Synthesizer (DDS) corresponding to the plurality of digital polyphase interpolation filters to generate a plurality of sequences of samples of digital waveform, there is one sequence of samples of digital waveform for each of the interpolated baseband phased samples, wherein the sequence of samples of digital waveform is phase synchronized with the corresponding interpolated baseband phased samples, wherein an effective frequency of the digital waveform equals a RF sampling rate divided by the number of the plurality of interpolated baseband phased samples; a set of mixer banks, there is one mixer bank for each filter bank, each mixer bank includes a plurality of parallel digital mixers to mix corresponding sequences of samples of digital waveform and interpolated baseband phased samples to up convert each sequence of interpolated baseband phased samples to the effective frequency; a parallel digital combiner to combine in-phase sequences of interpolated baseband phased samples of different frequency bands to produce a plurality of sequences of multiband upconverted samples; a pulse encoder to modulate and encode the plurality of sequences of multiband upconverted samples to produce a plurality of encoded multi-band signals; a serializer to convert the plurality of encoded multi-band signals into a RF bitstream; and an E/O interface to convert the RF bitstream to optical signals to output via optical fiber.

BRIEF DESCRIPTION OF THE DRAWINGS

FIG. 14B shows a table providing a mapping relationship of 8 MGT(0~7) to represent 7-levels of RFin according to one embodiment.

DETAILED DESCRIPTION

Figure 1A:
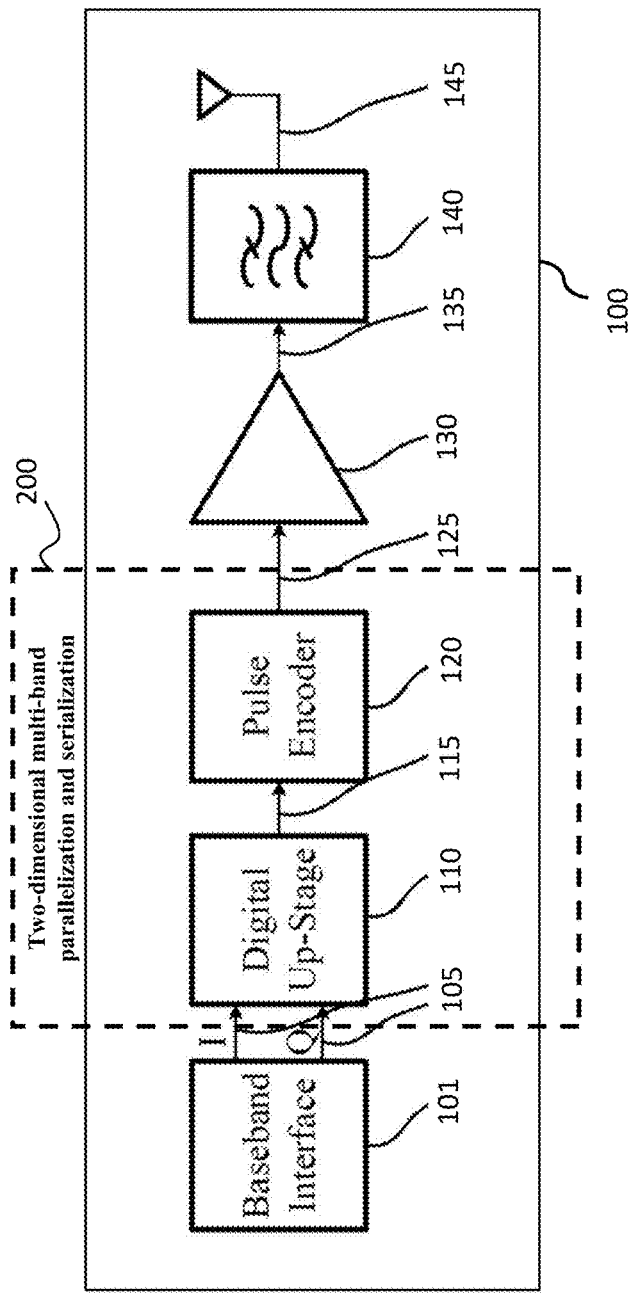
FIG. 1A shows a schematic illustrating some principles employed by different embodiments.

FIG. 1A shows a schematic illustrating some principles employed by different embodiments. For example, radio frequency (RF) all-digital transmitter (ADT) system 100 receives baseband samples 105 having inphase (I) and quadrature (Q) components from a baseband interface 101 and then digitally up-converts the samples 105 with digital up-stage converter 110 to RF frequency bands. For example, the up-stage conversion 110 can be performed by multiplication of the baseband samples and RF frequency signals. The upconverted signal 115 is then encoded by a pulse-encoder 120 using, e.g., pulse width modulation, delta-sigma modulation, and/or hybrid modulation to generate encoded signals 125, also referred as pulse train signals 125. In some implementations, the pulse train signals 125 are 2-level signal waveform (1-bit) or multi-level waveform depending on the type of pulse encoder 120. The encoded signal 125 is amplified by a power amplifier 130, which is preferred to operate in a switched-mode (only ON/OFF status) to achieve high efficiency. Filter 140 is a bandpass filter to filter out the outband emission of amplifier 130 output signal 135 before emitted by antenna 145 to the open space. The outband emission in the encoded signal is mainly introduced by the pulse encoder 120 and further distorted by amplifier 130. To that end, the outband emission should be kept as low as possible to reduce interference with neighbor frequency user. For example, for the signal 125, multi-level signal normally has lower emission than 2-level signal.

Such an architecture provides better performance in terms of carrier frequency agility. However, this architecture also leads to stringent requirements in the design of the pulse encoder being clocked at least at twice the RF carrier frequency. To that end, some embodiments provide multi-band parallelization and serialization 200 of the transmitted signal to reduce the complexity of operation of the pulse encoder 130. Specifically, it is realized that multi-band signal can be parallelized in two dimensions, i.e., within each band and across the bands. In such a manner, the parallelization can be achieved not only for the separate bands, but also for the combination of the bands. Due to multi-band parallelization, the temporal continuity in every clock tick unrolls in the vertical line (inter-phase timing continuity). Thus, instead of just having one phase being clocked at a given sampling rate, which is higher than at least twice the required carrier frequency, in some embodiments, the maximum sampling rate of each phase is reduced of a factor of M equal to a number of parallel processes for each band.

Figure 1B:
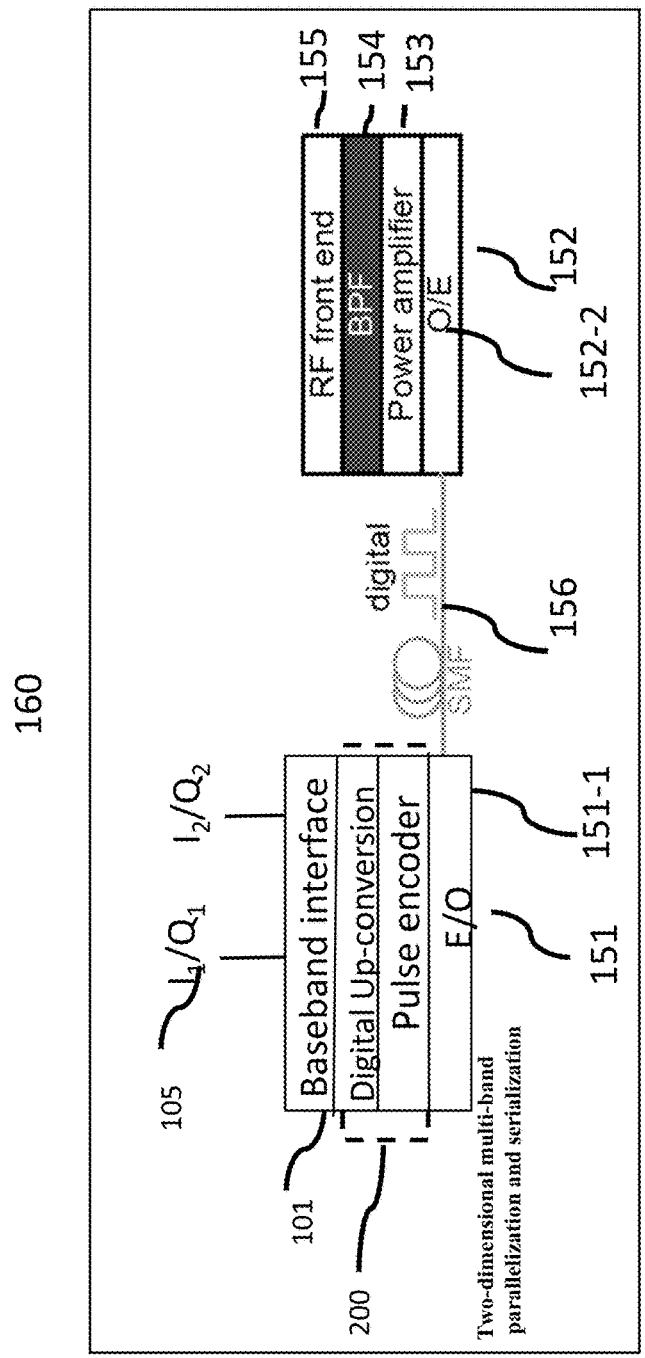
FIG. 1B shows a schematic illustrating some principles employed by different embodiments for optical front haul application.

FIG. 1B shows the optical link 160 consists of DU (Data Unit) 151, fiber 156, and RRU (Remote Radio Unit) 152. The DU 151 consists of 101 baseband processing unit, as described in FIG. 1A 101, it receives 105 the baseband information signals I$_1$/Q$_1$ or multiband I$_1$/Q$_1$, and I$_2$/Q$_2$ and so on. The 200 units has the same architecture as mentioned in FIG. 1A 200 and to be detailed described in FIG. 2. According to some embodiments, the optical link 160 may be arranged by including the DU (Data Unit) 151, the RRU (Remote Radio Unit) 152, and an E/O (electrical to optical converter) unit 151-1. In this case, the E/O 151-1 transmits optical signals converted by the E/O unit 151-1. As the E/O 151-1 includes one or more than one optical output ports (not shown), one or more than one fibers 156 can be connected to the one or more than one optical output ports to transmit the converted optical signals.

For instance, a bandpass Delta-Sigma (ΔΣ) or PWM pulse encoder can perform the encoder based on the digitally updated signals. It can provide a signal processing of high speed data rate by parallelization as given in FIG. 2, to support multi-signals simultaneously. For instance, single mode fiber 156 (SMF) is used to transmit the optical signals after the E/O (electrical to optical converter) conversion. It is in the format of high speed bit trains. The fiber is connected remotely with RRU unit 152, which consists of O/E 152-1 (optical to electrical conversion) and power amplifier 153 to amply the high frequency electrical signals. BPF 154 (bandpass filter) is used to remove the out of band noise before feeding it to the RF Front end 155. This 160 optical link is aimed to support and simplify next generation (5G) basestation, but not limited to 5G basestation front haul. The advantages is that one can use the same platform to transmit concurrent multi-standards signals such as 4G LTE and 5G signals at the same time, instead of dedicated RRU conventionally. In some cases, the front haul case can function reversely as high speed digital receiver in the back-haul based on reciprocity.

As can be easily understood that, the FIG. 1b can be also used for receiver applications, whereas RRU 152 receives the electrical signals, and then send it through optical link 156. DU 151 then processes the optical signals via E/O 151-1. The advantages of block 200 hold both for transmitting and receiving applications, in terms of reduce hardware cost, miniaturization, and re-configurability due to digital processing nature instead of analog counterpart. It can be seen that 160 is suitable for a variety of applications including wireless communication front haul and backhaul of basestation of 4G and 5G, communication for distributed active antenna system (DAS) of small cells, and optical long haul transportation.

Figure 2:
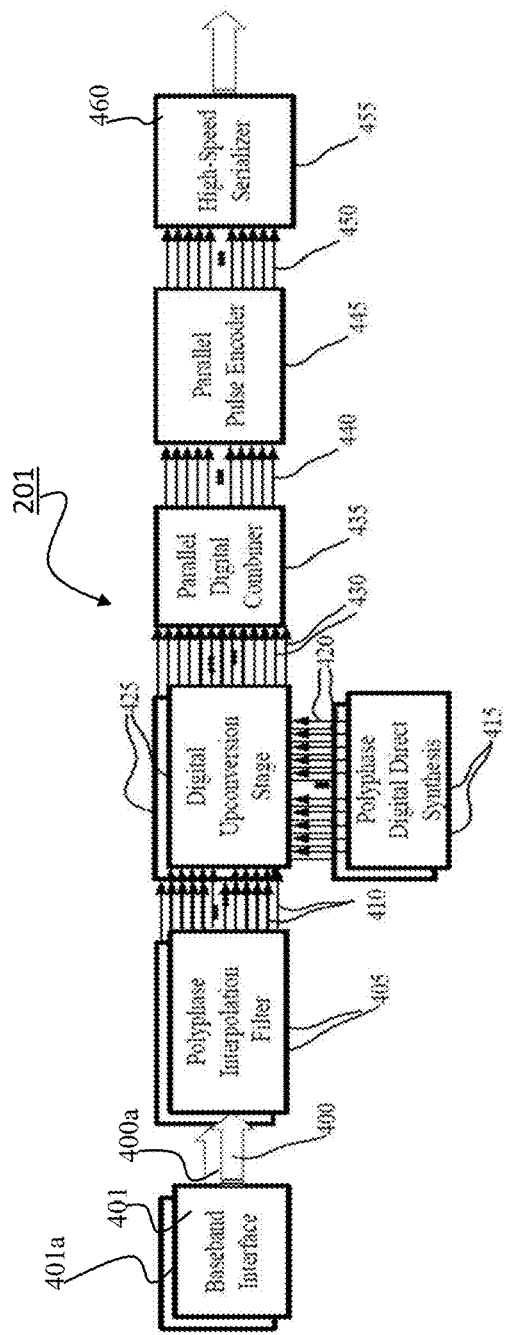
FIG. 2 shows a block diagram of a RF transmitter for wireless communication according to some embodiments.

FIG. 2 shows a block diagram of a RF transmitter 201 for wireless communication according to some embodiments. The RF transmitter includes a set of input ports of baseband interface 401 to receive baseband samples 400 to be transmitted on a set of joint and/or disjoint frequency bands. The baseband samples are discretization of the baseband signal into the digital domain.

In some embodiments, each input port receives a sequence of baseband samples for transmission on a corresponding RF frequency band. For example, the input port 401 receives samples 400 for one frequency band, and an input port 401a receives samples 400a for another frequency band, which can be disjoint from the frequency band of samples 400. Multiple input ports for samples of multiple frequency bands provide a first dimension of two-dimensional parallelization.

To enable a second dimension of the two dimensional parallelization, the RF transmitter includes a set of filter banks, such that there is one filter bank 405 for each input port, i.e., one filter bank for each frequency band. Each filter bank includes a plurality of digital polyphase interpolation filters to sample a rotatably shifted phase of the corresponding sequence of baseband samples and to interpolate the sampled phases to produce a plurality of sequences of interpolated baseband phased samples with the rotatably shifted phase.

Each digital polyphase interpolation filter includes a polyphaser filter combined in series with an interpolator. Polyphase is a way of doing sampling-rate conversion. The polyphaser filter is a structure that allows using filters in multirate setting and to perform the sampling-rate conversion in the multirate setting. In such a manner, a set of filter banks 405 interpolate each one of the baseband sample 400 representing the disjoint frequency bands. At the same time that the samples are interpolated, they are distributed over M phases 410, while also ensuring a temporal continuity between phases, in every clock tick. The phases in 410 represent both the In-phase/Quadrature (I/Q) samples.

Following the principles of two-dimensional parallelization, the RF transmitter includes a set of oscillator banks 415, such that there is one oscillator bank 415 for each filter bank 405. Each oscillator bank includes a plurality of polyphase Digital Direct Synthesizer (DDS) corresponding to the plurality of digital polyphase interpolation filters to generate a plurality of sequences of samples of digital waveform 420. There is one sequence of samples of digital waveform for each of the interpolated baseband phased samples. For example, if the filter 405 generates M interpolated baseband phased samples, the oscillator bank generates M digital waveforms. The sequence of samples of digital waveform is phase synchronized with the corresponding interpolated baseband phased samples. By the way of construction, an effective frequency of the digital waveform equals a RF sampling rate divided by the number, M, of the plurality of interpolated baseband phased samples.

Multiple digital waveforms for each frequency band allows up-conversion of the multi-band signals 410, while preserving two-dimensional parallelization. To that end, the RF transmitter includes a set of mixer banks 425, such that there is one mixer bank for each filter bank. Each mixer bank includes a plurality of parallel digital mixers to mix corresponding sequences of samples of digital waveform 420 and interpolated baseband phased samples 410 to up convert each sequence of interpolated baseband phased samples to the signals 430 of the effective frequency.

The RF transmitter includes a parallel digital combiner 435 to combine in-phase sequences of interpolated baseband phased samples of different frequency bands to produce a plurality of sequences of multiband upconverted samples 440, includes a multiband pulse encoder 445 to modulate and encode the plurality of sequences of multiband upconverted samples 440 to produce a plurality of encoded multiband signals 450, and includes a serializer 455 to convert the plurality of encoded multi-band signals into a RF bitstream 460.

The combiner 435 combines in-phase samples of different frequency bands, thereby reducing two-dimensional parallelization into a one-dimensional parallelization. For example, because the samples are in phase, but belong to a different frequency bands, the combination of the samples in some embodiments is a mathematical summation. Such a dimensionality reduction allows using pulse encoder 445 suitable for single band encoding at the effective frequency, which simplifies the implementation of the pulse encoder.

In addition, the RF transmitter includes a power amplifier, such as an amplifier 130 to amplify the RF bitstream, a multiband RF filter, such as a filter 140, to filter the amplified RF bitstream to produce an RF analog signal, and at least one antenna 145 to radiate the RF analog signal.

Figure 3A:
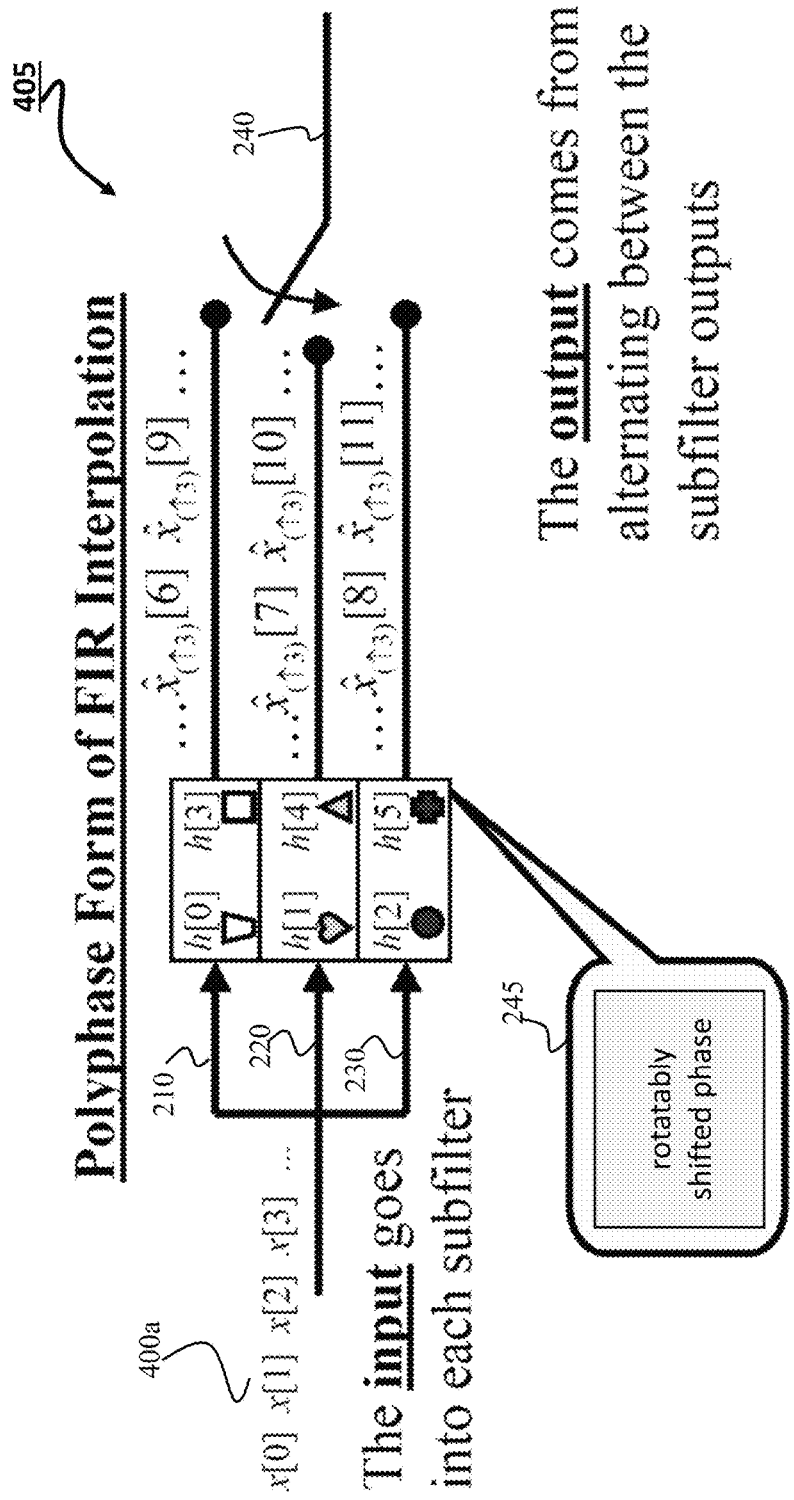
FIGS. 3A and 3B show schematic of principles employed by a digital polyphase interpolation filter according to some embodiments.
Figure 3B:
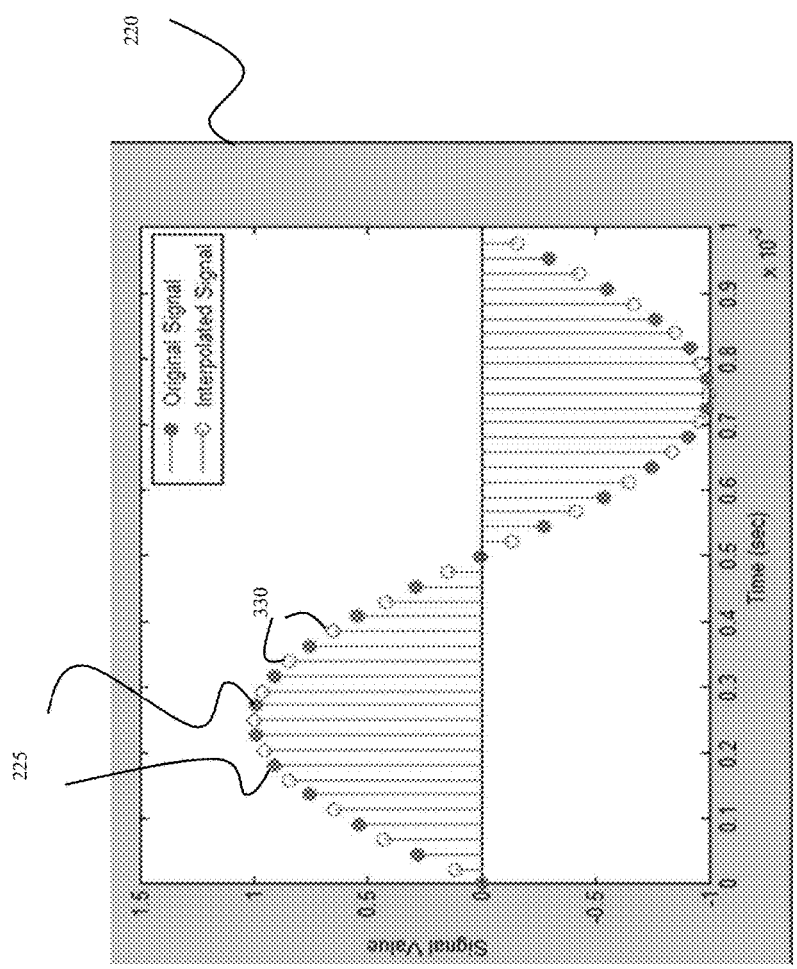

FIGS. 3A and 3B show schematic of principles employed by a digital polyphase interpolation filter according to some embodiments. The input samples, e.g., samples 400a, goes into each subfilter h[n], e.g., 210, 220, and 230, running at a slow rate. As can be seen in FIG. 3A, because each sample correspond to a phase of the transmitted signal, each subfilter samples shifted phase of the signal represented by the samples 400a. The filtered samples are interpolated after filtering, as shown in FIG. 3B. For example, the output 225 that comes from alternating 240 between the outputs of the subfilters 210, 220, and 230 is interpolated with the values 230 of the interpolated signal. The interpolation depends on the type of the signal represented by the samples 400 and 400a and the interpolation estimates the value of that signal for an intermediate value of the samples outputted by the subfilters. For example, the interpolation can be sinusoidal, polynomial, and/or spline interpolation.

The polyphaser interpolation increases the sampling rate of baseband sample rate FsBB to RF sample rate FsRF, dividing the sample in M different phases. Polyphase filter is an architecture of doing sample rate conversion that leads to very efficient implementations. The resulting discrete time signal has a sample rate M times the original sampling rate, with each path is running at a low rate but output signal has high rate due to polyphaser architecture. Computational saving achieved by filtering at lower sampling rate.

Figure 4:
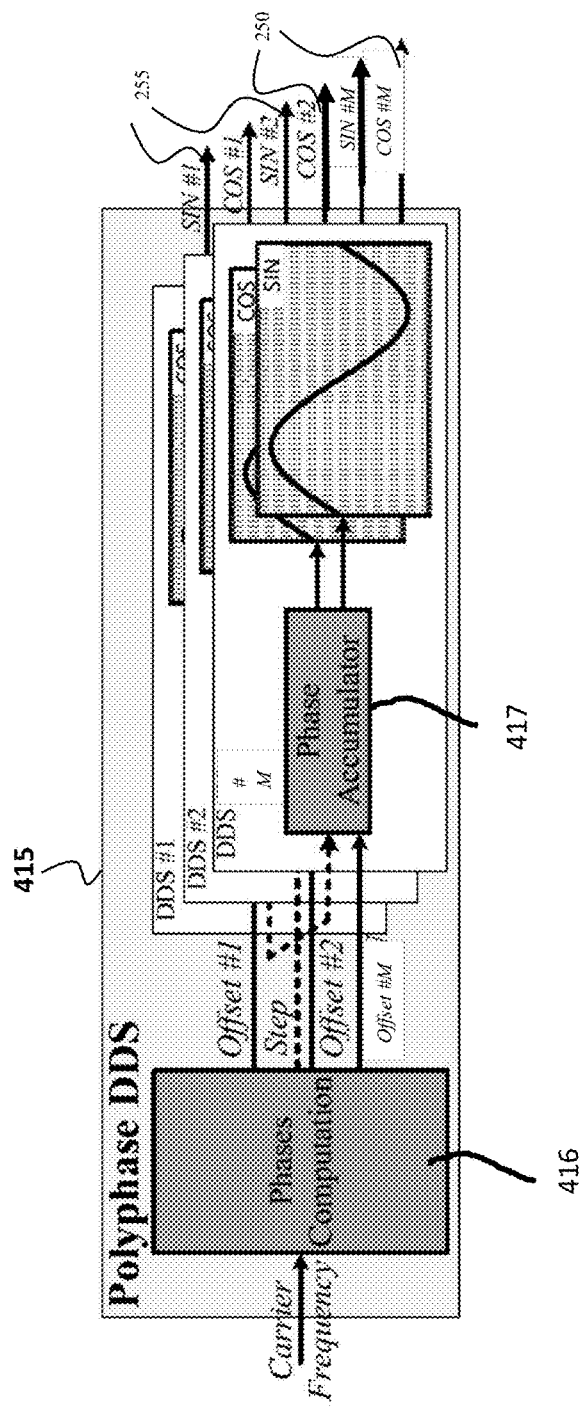
FIG. 4 shows a schematic of an oscillator bank corresponding to a filter bank according to some embodiments.

FIG. 4 shows a schematic of an oscillator bank corresponding to a filter bank according to some embodiments. Specifically, there is one oscillator bank for each polyphaser interpolation filter bank of 405, such that N(#number of RF carrier frequency) copies of Polyphase Digital Direct Synthesis (DDS) 415 operates to generate the cosine 250 and sine 255 samples from the desired RF frequency bands 420. Here again, the samples are distributed over M phases between the different phases, for every clock tick. There is one sequences of samples of digital waveform 420 for each of the interpolated baseband phased samples 410.

Some embodiments are based on recognition that a single-rate DDS is difficult to be used in this particular case, because it is difficult to achieve a sampling rate equal to the serializer's sampling frequency (FsRF) due to hardware speed limit. To overcome this problem, some embodiments use a polyphaser to achieve equivalent sampling rate of the single-rate DDS. Since the DDS is a feedforward system, polyphase techniques do not significantly impact the critical path. In its essence, polyphase combines M single-rate DDS modules. Each DDS has a specific phase accumulator and two read-only memories containing the sine and the cosine waveforms. The DDS modules work in parallel to simultaneously generate M samples of the required RF carrier frequency ($\omega c$) waveform. Each of the DDS is actually working at a rate M times lower than the equivalent global sampling rate. Thus, it is possible to achieve a global sampling rate equal to the serializer's sampling frequency FsRF with M different phases being clocked at FsBB.

In some implementations, the phase computation block 416 performs the mapping between the desired carrier frequency, the phase step, and the respective DDS phase offset. The minimum frequency resolution ($\Delta f$) is computed as in the classical single-rate DDS, but now with a sampling rate N times higher $$\Delta f = \frac{F_{SBB}M}{2^L} = \frac{F_{SRF}}{2^L} \quad (1)$$

where L is the number of bits from each phase accumulator 417.

Figure 5:
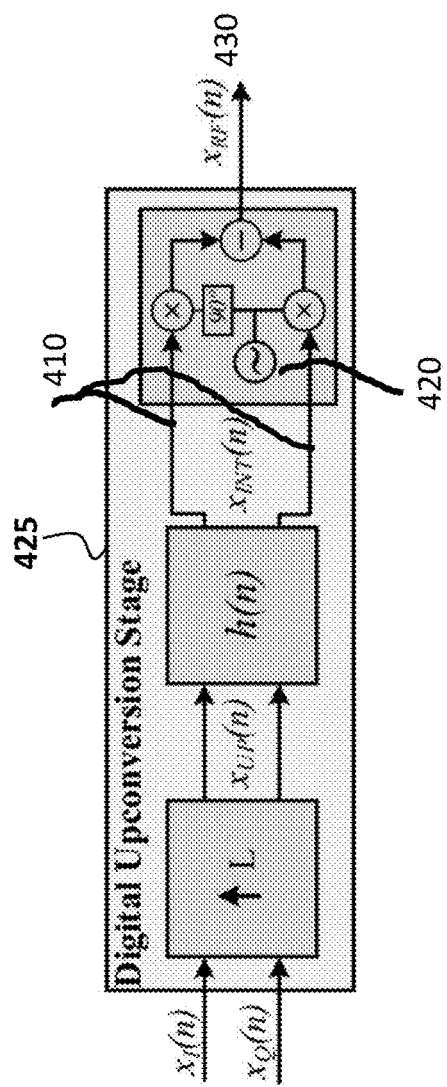
FIG. 5 shows a schematic of digital upconversion stage used by the transistors of some embodiments.

FIG. 5 shows a schematic of digital upconversion stage used by the transistors of some embodiments. Interpolated baseband samples 410 real part and imaginary part Re[$X_{INT}$(n)] and Im[$X_{INT}$(n)] is multiplied with 420 cosine and sine of RF frequency samples at carrier frequency ($\omega c$), and then subtracted. The subtraction is then 430 the RF samples $X_{RF\,(n)}$. It is duplicated for each RF carrier frequency bands.

Equation (2) explains the architecture of operation of the DUC (digital upconversion stage).

$$x_{RF}(n) = \mathrm{Re}[x_{INT}(n)e^{j\omega_c n}] \quad (2)$$
$$= \mathrm{Re}[x_{INT}(n)]\cos(\omega_c n) - \mathrm{Im}[x_{INT}(n)]\sin(\omega_c n).$$

A parallel DUC comprising 2N multipliers and N subtracters 425, perform the element-wise operation between the M phases from the I-component and the Q-component of 410, the M phases from the sine and cosine waveforms of 420, as given in Eq. (2). This operation is formally equivalent to a digital upconversion from DC to the desired RF carrier frequency. These operations are performed in parallel for all the N bands of RF carrier frequency.

Figure 6:
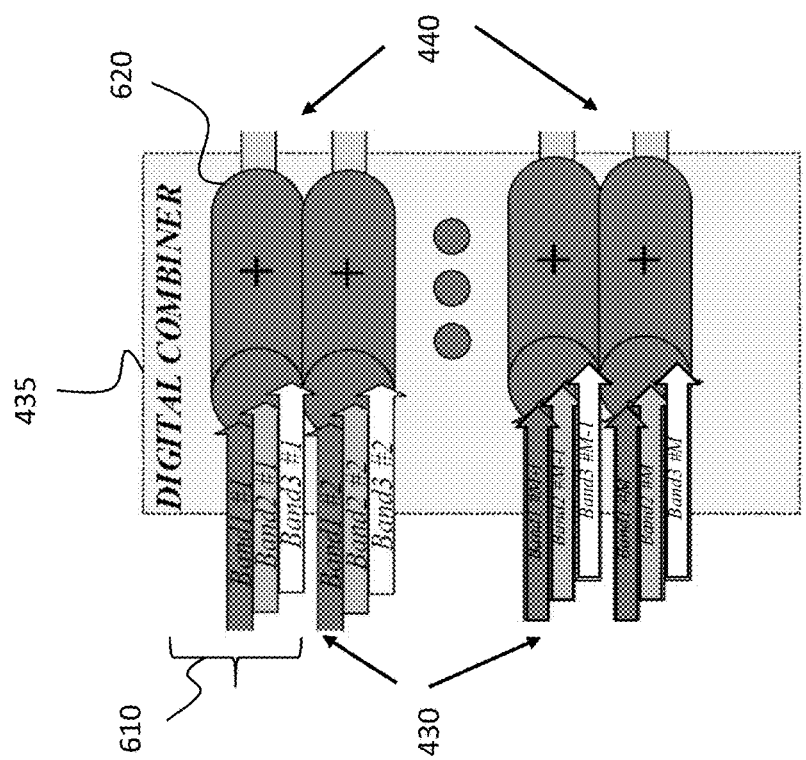
FIG. 6 shows a schematic of an exemplar combiner for combining signals of three bands according to some embodiments.

FIG. 6 shows a schematic of an exemplar combiner 435 for combining signals 430 of N=3 bands according to some embodiments. The embodiments make use of parallel/polyphaser architecture of each single band and combine each band's polyphased samples first then applying one multiband pulse encoding onto these combined samples, which enables the noise shaping to occur effective for multi-band transmission. These are the unique challenges compared with single band case.

All M-phased samples of each band of N is in-phased combined by mathematically adder 620 of the parallel digital combiner 435. The resultant signals 440 have the information from all RF bands of N.

Different embodiments use different methods to perform the pulse encoding. For instance, different embodiments perform the pulse encoding using Delta-Sigma Modulation, Pulse-Width Modulation, Pulse-Position Modulation, or some combination thereof. Different embodiments extend different method with the design techniques to ensure that the parallelization can be done in order to achieve a required global sampling rate.

Figure 7A:
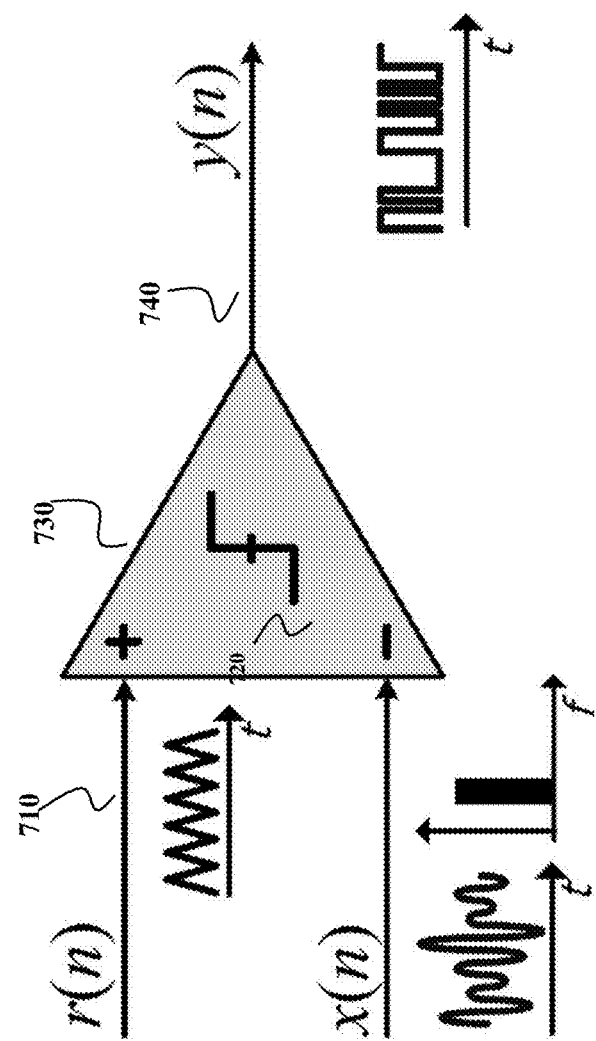
FIG. 7A shows a schematic illustrating PWM concept used by one embodiment for pulse encoding.

FIG. 7A shows a schematic illustrating PWM Concept used by one embodiment for pulse encoding. This embodiment use pulse width modulation based on comparison 730 between two in-bit signals: the desired signal x(n) 720 and a reference waveform r (n) 710 with a uniform amplitude distribution, to generate the output signal y(n) 740.

Figure 7B:
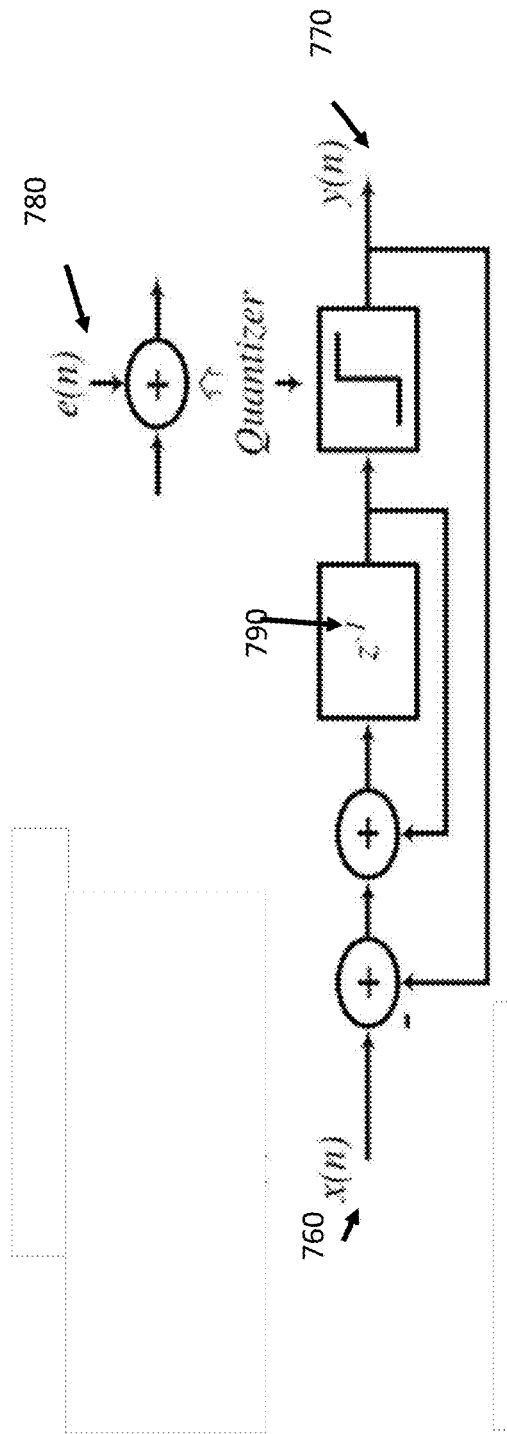
FIG. 7B shows a schematic of a delta-sigma modulator used by one embodiment for pulse encoding.

FIG. 7B shows a schematic illustrating DSM (delta-sigma modulator) concept used by one embodiment for pulse encoding. This embodiment is based on oversampling and quantization a time varying signal x(n) 760 and encode it to a bi-level or multi-level quantized signal y(n) 770. A feedback signal contains the quantized signal subtracted from input signal 760. 780 represents the quantization error e(n). 790 is the signal transfer function. Equ (3)

$$Y(z)=z^{-1}X(z)+(1-z^{-1})E(z) \quad (3)$$

Explains the transfer function of DSM. The STF (signal transfer function) is $Z^{-1}$, and NTF (noise transfer function) is $(1-Z^{-1})$. The quantization noise is filtered and pushed away from signal, leading to an enhanced signal to noise ratio. There is also various implementation of DSM in practice, depending on the order of transfer functions.

Figure 7C:
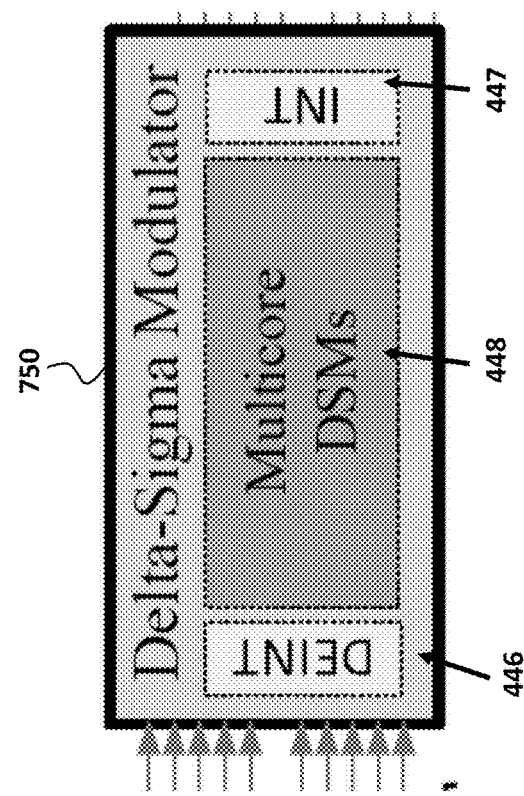
FIG. 7C shows a schematic of a delta-sigma modulator used by one embodiment for pulse encoding.
Figure 7D:
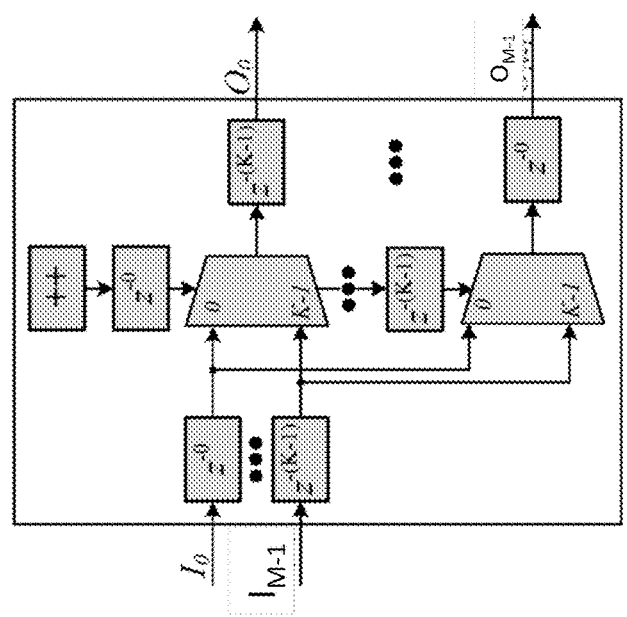
FIG. 7D shows a schematic of a Corner Bender Matrix Transposer according to one embodiment.

FIG. 7C shows a schematic of a delta-sigma modulator 750 used by one embodiment for pulse encoding. In this embodiment, the pulse encoder is implemented as a parallel representation of delta-sigma modulator to encode the combined signal. This embodiment is based on understanding that to enable flexible RF carrier frequencies generation, Delta-sigma modulation is more preferred method to perform pulse encoding, due to the nature of its quantization noise shaping features and oversampling, which minimize the outband emission, as explained above When Delta-sigma modulation 445 is selected, in addition to the parallelization of M delta-sigma modulators (multi-core delta sigma modulator 448), some implementations use extra modules, i.e., Deinterleaving 446 and Interleaving Modules 447. Deinterleaving 446 and Interleaving Modules 447 modules are often need to be optimized to accommodate the hardware resource challenges in practical implementation. The Deinterleaving 446 and Interleaving Modules 447 modules are configured to accommodate and re-arrange the input/output data. The aim is to ensure that the feedback loop from each Delta-sigma modulator is processing contiguous samples of the input signal. For example, techniques such as Corner Bender Matrix Transposer can be applied to reduce the amount of samples that must be temporarily stored in the blocks of 446 and 447. This technique as shown in FIG. 7C shows the transposer of Input and Output N independent slice (of size K). The design doesn't use FIFOs (first in first out), and it is fully synchronous, and only uses fixed size shift register delays. The same module is used for both 446 and 447. The inclusion of this module enabled a drastic reduction of Block Random-Access Memory (BRAM) resource usage. The number of K-size slices corresponds to the number of parallel phases (M).

Figure 8:
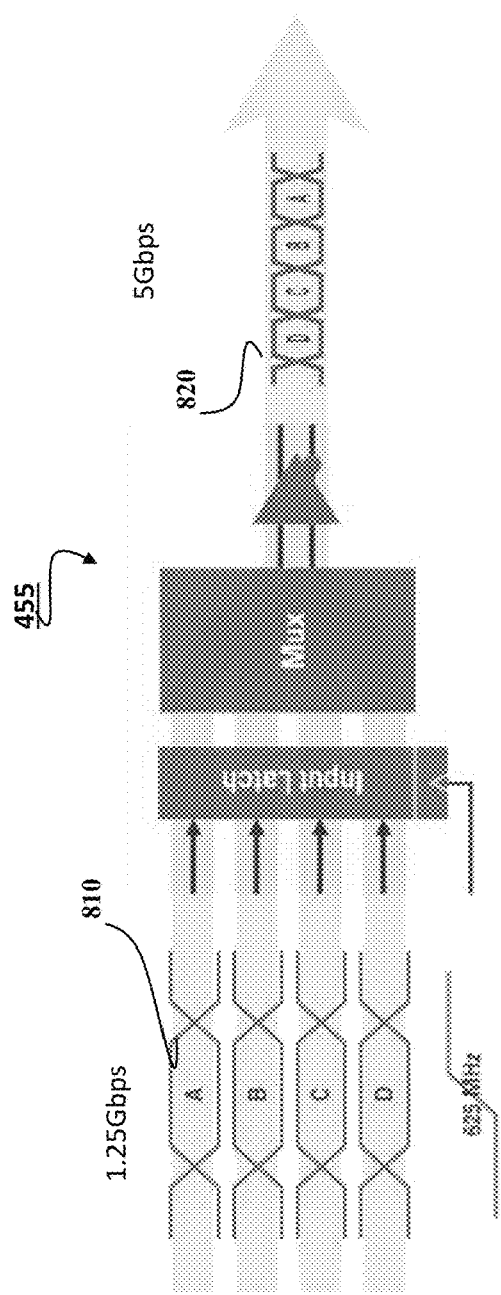
FIG. 8 shows a schematic of a serializer used by one embodiment to serialize the encoded signals.

FIG. 8 shows a schematic of a serializer 455 used by one embodiment to serialize the encoded signals 450 from parallel pulse encoder 445. This exemplar serializer is configured to convert low speed parallel signals (1.25 Gbps) 810 to a high speed series signals (5 Gbps) 820 by interleaving the bits. The output transmit clock rate is multiple of parallel clock of input signals. The modern FPGA platform offers the ultra-high speed serializer module (>10 Gbps), on the basis of which the current embodiment is able to offer the flexibility of RF carrier frequency generation frequency range. The upper frequency range is usually half of the serializer maximum clock rate.

The serializer of FIG. 8 is designed for two outputs levels of the encoded signal. However, different embodiments may use serializers designed for multi-bit buses. For example, one embodiment replaces the high-speed serializer by a plurality of high-speed serializers, that when combined, enable the representation of multi-bit signals.

Figure 9:
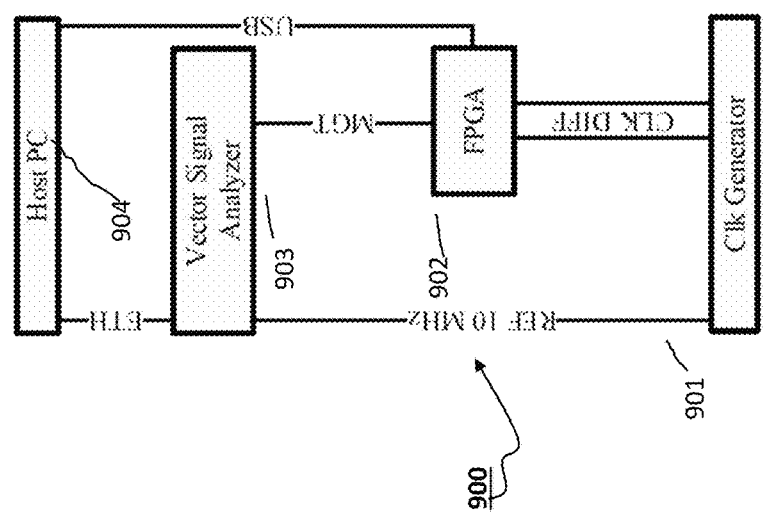
FIG. 9 shows an exemplar setup used to test one of the embodiments.

FIG. 9 shows an exemplar setup 200 used to test the implemented ADT for one of the embodiments. An external clock generator 901 provides the clock for FPGA (field programmable gate array) 902 in differential form (CLK DIFF). The FPGA 902 is the platform to implement the ADT algorithms, and usually MGT (multi-gigabit transceiver) interface of 902 is used to generate high speed encoded RF bitstream 125, followed by RF amplifier 130 and filter 140. VSA (Vector signal analyzer) 903 is the equipment used to measure the frequency domain of 125 RF bitstream. The host PC 904 is used for control and communication with FPGA via USB (Universal Serial Bus) and measurement with VSA 903 through Ethernet (ETH). Typically, reference signal for instance 10 MHz is also provided by 901 to 903 for synchronization. Test setup 900 verifies the feasibility of RF-ADT according to various embodiments.

Figure 10:
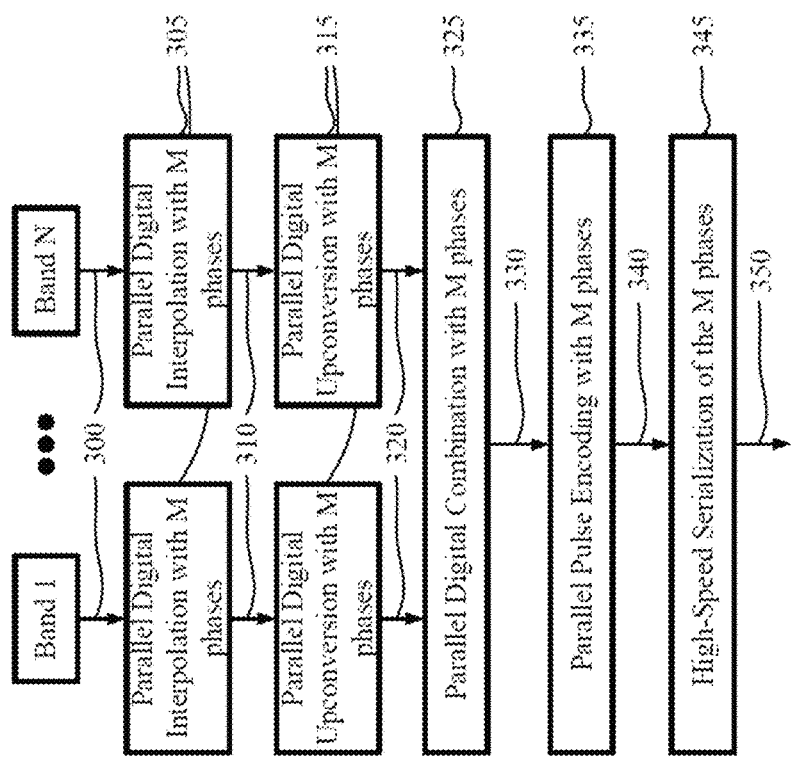
FIG. 10 shows an exemplary flowchart of signal transmission according to one embodiment, which is scalable to N bands.

FIG. 10 shows an exemplary flowchart of signal transmission according to one embodiment, which is scalable to N bands. The multiple baseband bands 300, representing a plurality of disjoint frequency bands, can be individually interpolated (by module 305) and upconverted (by module 315) to the given carrier frequency, leading to the signals 320. However, to alleviate the timing requirements, the samples are distributed over M phases in 320. Afterwards, the M phases corresponding to each baseband band are added in a Parallel Digital Combiner 325, while maintaining the same number of phases. Then, a parallel-version of a Pulse Encoder 335 operates the M phases of 330, generating an equivalent with a lower number of output levels 340. This output is also divided over M phases, that will then be serialized by a high-speed serializer 350. The typical number of outputs levels is two. However, the embodiment is valid for multi-level buses. In the latter case, the high-speed serializer can be replaced by a plurality of high-speed serializers, that when combined, enable the representation of multi-level signals.

Figure 11:
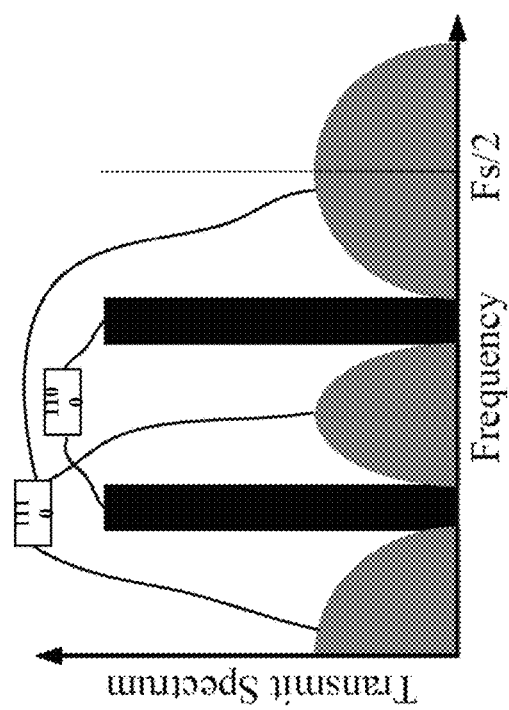
FIG. 11 shows a schematic of a spectrum of a concurrent non-contiguous multi-band transmitter according to some embodiments.

FIG. 11 shows a schematic of a spectrum of a concurrent non-contiguous multi-band transmitter according to some embodiments. This case reports a dual-band scenario where two bands 1100 are transmitted. The distortion and quantization noise from the Pulse Encoder 1110 are filtered by the bandpass filter before radiation to minimize interference issues.

Figure 12:
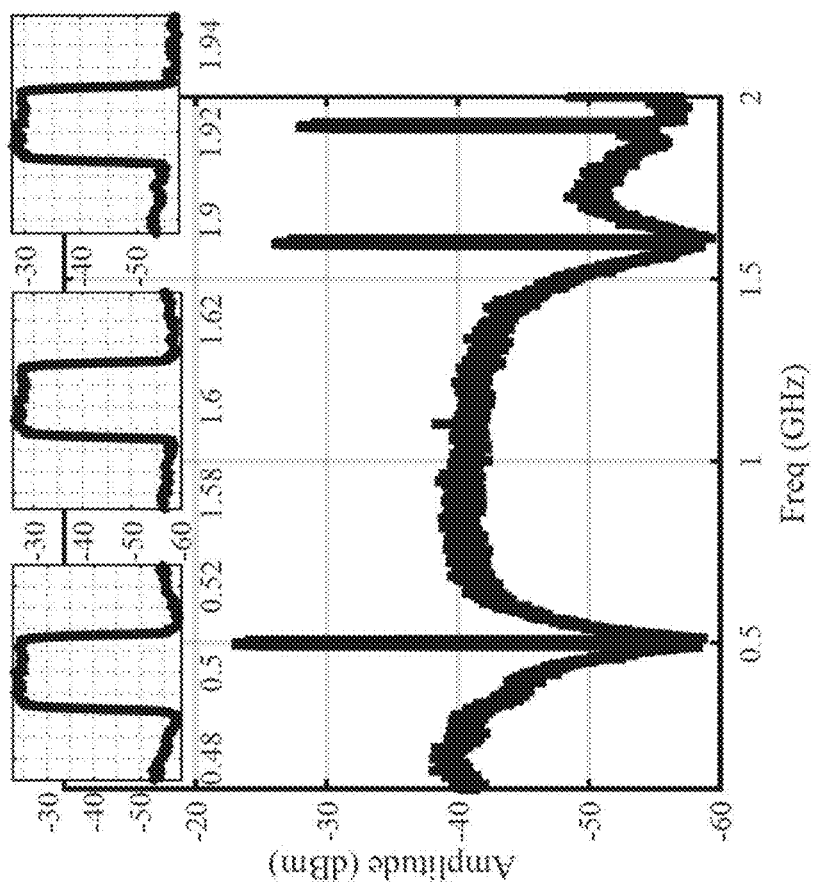
FIG. 12 shows a schematic of a spectrum measured from a transmitter of some embodiments embedded with a serializer frequency of 4 Gbps.

FIG. 12 shows a schematic of a spectrum measured from a transmitter of some embodiments embedded with a serializer frequency of 4 Gbps. The triple bands have 16-Quadrature Amplitude Modulation (QAM) modulated signals with 18.75 MHz of bandwidth. The implementation is embedded into a Field-Programmable Gate Array (FPGA) with a serializer running at 4 Gbps. All the logic subsystems are being clocked at 62.5 MHz. Notably, for achieving the same spectrum, the single-rate architectures should have all the subsystems being clocked at least at 4 GHz.

Some embodiments are based on understanding that the spectrum performance of all-digital transmitter for multi-level output is superior than 2-level case, due to improved quantization levels. To enhance the system performance (assessed in terms of Adjacent-Channel Power Ratio (ACPR), Error-Vector Magnitude (EVM) and SNR), a final stage that performs an extension to a multilevel output is introduced. The synthesis of this multi-level output is based on the combination of pulsed trains.

Figure 13:
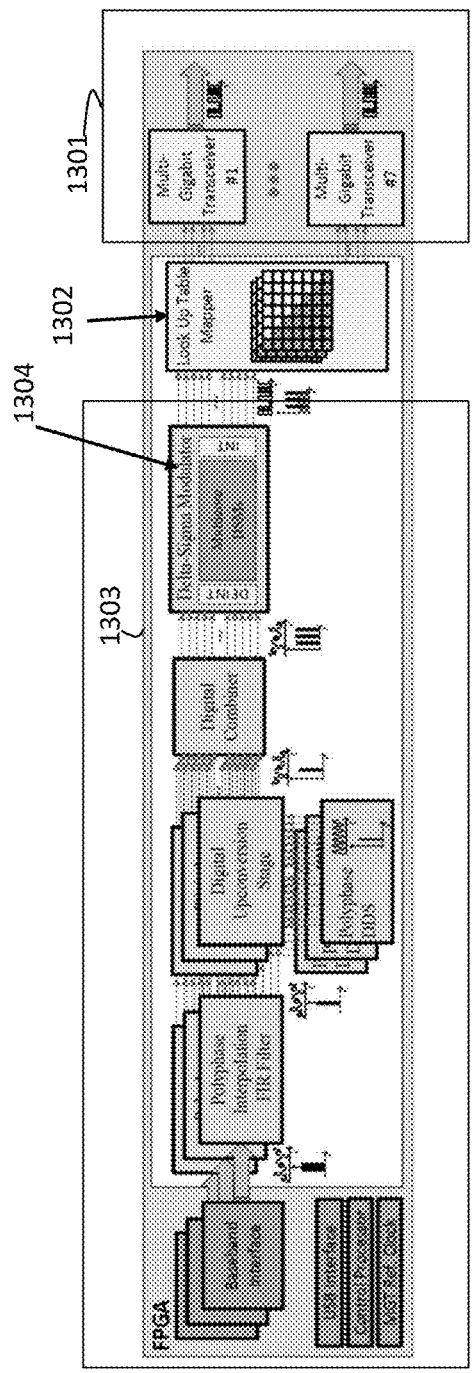
FIG. 13 shows a schematic of a multi-level digital transmitter architecture according to one embodiment.

FIG. 13 shows a schematic of a multi-level digital transmitter architecture according to one embodiment. The output 1301 has several high speed interface, for example MGT (multi-gigabit transceiver) interfaces available in FPGA platform, which enables the high speed readout of bitstreams. Each multi-gigabit transceiver interface is generating a two-level RF bitstream. A schematic 1303 shows the system block diagram similar to the diagram of a transistor 201. In this case, however, the pulse encoder uses a delta-sigma modulator 1304 with multi-level amplitudes. To that end, the transmitter includes a mapper 1302 to control the operating of each transceiver of 1301.

Figure 14A:
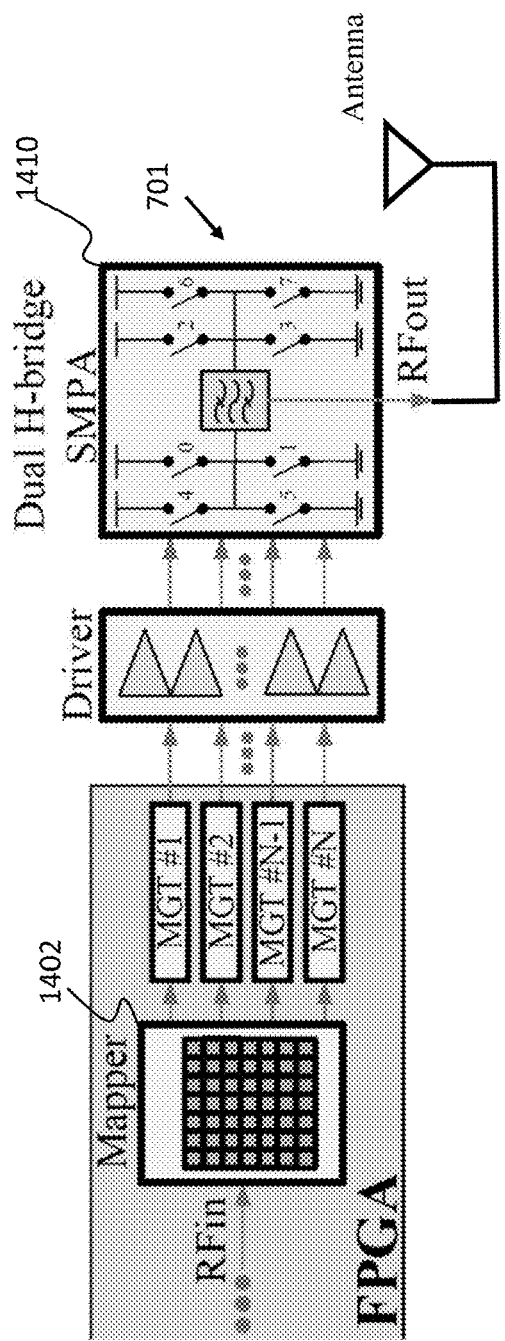
FIG. 14A shows a schematic of an application of multi-bit ADT using H-bridge SMPA as an amplifier stage according to some embodiments.

FIG. 14A shows a schematic of an application of multi-bit ADT using H-bridge SMPA as an amplifier stage according to some embodiments. For example, seven different Multi-Gigabit Transceivers (MGTs) are used instead of just one MGT for single-bit of 2 level, and the Look-Up Table Mapper 1402 is included before the MGTs. This Look-Up Table Mapper converts a multi-level input signal into a combination of seven different pulsed train sequences. The mapper is designed according to the used analog combination network. For instance, Dual-H-bridge SMPA 1410 is used both as amplification and combining function. The combined RF out after bandpass filter is connected to antenna to transmit signals at multi RF bands.

FIG. 14B shows a table providing a mapping relationship of 8 MGT(0~7) to represent 7-levels of RFin according to one embodiment. In this embodiment, 1 or 0 in the table indicates the operation conditions of 8 transistors of 1401, being ON or OFF. For instance, a 3-level output (dark gray background), a 5-level output (dark gray and light gray background), or a 7-level output (by using all the table elements).

According to embodiments described above, other advantages can be provided for 5G using phased array, where RF signals radiated by antennas is formed in a beam. This will help to focus the energy in the desired directions towards targeted mobile user terminals in certain directions, instead of in a quite wide sector area in the previous generation of wireless commination such as 3G and 4G. Beamforming helps to overcome the high signal path loss at high frequency with introduced antenna directivity, and can also benefit to the interference minimization with controllable beam steering angles.

In addition, as in the digital beamforming phased array applications, the beamforming algorithm can be implemented in the digital baseband by mathematically control the baseband signal's weighting factor as well as phase-delays (equivalent to time-delay).

It should be noted that the embodiments discussed above can be applied to 3GPP Base station like eNode B and User Equipment as multi-band transmitter. For the User Equipment (like smartphone, IoT Device), this architecture can support various combination of wireless communication transmitter. Typical case is to support (1) several 3GPP generation like 2G, 3G, LTE and 5G, (2) Multiple 3GPP generation and Wi-Fi, and (3) 3GPP Carrier Aggregation. So the combination of transmission is flexible because of digital transmission.

The above-described embodiments of the present disclosure can be implemented in any of numerous ways. For example, the embodiments may be implemented using hardware, software or a combination thereof. Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the embodiments of the present disclosure may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Although the present disclosure has been described by way of examples of preferred embodiments, it is to be understood that various other adaptations and modifications can be made within the spirit and scope of the present disclosure. Therefore, it is the object of the appended claims to cover all such variations and modifications as come within the true spirit and scope of the present disclosure.

We claim:

1. A high speed digital bit generator for an optical frontal interface comprising:
   a set of input ports to receive baseband samples of a signal to be transmitted on a set of disjoint frequency bands, each input port receives a sequence of baseband samples for transmission on a corresponding RF frequency band;
   a set of filter banks, there is one filter bank for each input port, each filter bank includes a plurality of digital polyphase interpolation filters to sample a shifted phase of the corresponding sequence of baseband samples and to interpolate the sampled phases to produce a plurality of sequences of interpolated baseband phased samples with the shifted phase;
   a set of oscillators banks, there is one oscillator bank for each filter bank, each oscillator bank includes a plurality of polyphase Digital Direct Synthesizer (DDS) corresponding to the plurality of digital polyphase interpolation filters to generate a plurality of sequences of samples of digital waveform, there is one sequence of samples of digital waveform for each of the interpolated baseband phased samples, wherein the sequence of samples of digital waveform is phase synchronized with the corresponding interpolated baseband phased samples, wherein an effective frequency of the digital waveform equals a RF sampling rate divided by the number of the plurality of interpolated baseband phased samples;
   a set of mixer banks, there is one mixer bank for each filter bank, each mixer bank includes a plurality of parallel digital mixers to mix corresponding sequences of samples of digital waveform and interpolated baseband phased samples to up convert each sequence of interpolated baseband phased samples to the effective frequency;
   a parallel digital combiner to combine in-phase sequences of interpolated baseband phased samples of different frequency bands to produce a plurality of sequences of multiband upconverted samples;
   a pulse encoder to modulate and encode the plurality of sequences of multiband upconverted samples to produce a plurality of encoded multi-band signals;
   a serializer to convert the plurality of encoded multi-band signals into a RF bitstream; and
   an E/O interface to convert the RF bitstream to optical signals to output via an optical fiber in a front haul case for digital transmitter, wherein the front haul case is configured to function reversely as high speed digital receiver in a back-haul application based on reciprocity.

2. The high speed digital bit generator of claim 1, wherein each digital polyphase interpolation filter includes a polyphaser filter combined in series with an interpolator.

3. The high speed digital bit generator of claim 1, wherein the pulse encoder is a multi-band pulse-width modulator.

4. The high speed digital bit generator of claim 1, wherein the pulse encoder is a delta-sigma modulator.

5. The high speed digital bit generator of claim 1, wherein the pulse encoder outputs a two-level encoded signal.

6. The high speed digital bit generator of claim 1, wherein the pulse encoder outputs a multi-level encoded signal, with a number of levels greater than two.

7. The high speed digital bit generator of claim 1, wherein the RF transmitter performs a two-dimensional parallelization of the signal across the multiple frequency bands and with each frequency band.

8. The high speed digital bit generator of claim 1, wherein the polyphase Digital Direct Synthesizer generates cosine and sine samples distributed over M phases for every clock tick, wherein the M phases corresponding to each baseband band in the parallel digital combiner.

* * * * *